United States Patent
Sano et al.

(10) Patent No.: US 6,397,775 B1
(45) Date of Patent: Jun. 4, 2002

(54) DEPOSITED FILM FORMING SYSTEM AND PROCESS

(75) Inventors: Hitomi Sano, Kyoto; Masahiro Kanai, Tokyo; Atsushi Koike, Kawasaki; Hiroshi Sugai, Funabashi, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/419,115

(22) Filed: Oct. 15, 1999

(30) Foreign Application Priority Data

Oct. 16, 1998 (JP) .......................................... 10-295446
Oct. 16, 1998 (JP) .......................................... 10-295447
Oct. 15, 1999 (JP) .......................................... 11-294122

(51) Int. Cl.[7] ............................................. C23C 16/00
(52) U.S. Cl. .............................. 118/723 I; 118/723 AN; 118/723 MW
(58) Field of Search ...................... 118/723 I, 723 AN, 118/723 MW, 50.1

(56) References Cited

U.S. PATENT DOCUMENTS

| | | | |
|---|---|---|---|
| 4,400,409 A | 8/1983 | Izu et al. ........................ 427/39 |
| 4,515,107 A | * 5/1985 | Fournier et al. ............. 118/718 |
| 4,694,264 A | * 9/1987 | Owens et al. .................. 333/34 |
| 4,841,098 A | * 6/1989 | Dunton ...................... 174/15.3 |
| 5,325,021 A | * 6/1994 | Duckworth et al. ..... 315/111.51 |
| 5,399,254 A | 3/1995 | Geisler et al. ......... 204/298.31 |
| 5,846,883 A | * 12/1998 | Moslehi ....................... 438/711 |
| 5,968,379 A | * 10/1999 | Zhao et al. ............. 219/121.52 |
| 6,081,414 A | * 6/2000 | Flanigan et al. ............. 361/234 |
| 6,124,834 A | * 9/2000 | Leung et al. ................ 343/867 |

FOREIGN PATENT DOCUMENTS

WO WO 9957753 11/1999

* cited by examiner

*Primary Examiner*—Olik Chaudhuri
*Assistant Examiner*—Erik Kielin
(74) *Attorney, Agent, or Firm*—Fitzpatrick, Cella, Harper & Scinto

(57) ABSTRACT

In a deposited film forming system having at least a vacuum vessel, means for feeding a film-forming material gas into the vacuum vessel, a discharge electrode provided inside the vacuum vessel, used to make the material gas into a plasma, and a power supply conductor for applying a high-frequency power to the discharge electrode, the system comprises an earth shield so disposed as to surround the power supply conductor inside the vacuum vessel, and a plurality of dielectric materials at least part of which is disposed between the power supply conductor and the earth shield. A process carried out using the deposited film forming system is also disclosed. The system and process can maintain large-area and uniform discharge for a long time and can form deposited films having a high quality and a superior uniformity, on a beltlike substrate that moves continuously.

4 Claims, 6 Drawing Sheets

DEPOSITED FILM FORMING SYSTEM AND PROCESS

BACKGROUND OF THE INVENTION

1. Field of the Invention

This invention relates to a system, and a process, for forming deposited films. More particularly, it relates to a deposited film forming system and a deposited film forming process which are able to form a large-area and uniform plasma and also may cause no difficulty in the power feeding course even when discharged for a long time. In particular, the deposited film forming system and process of the present invention is preferably used to continuously produce semiconductor thin films which constitute photovoltaic devices such as solar cells making use of amorphous silicon or amorphous alloys.

2. Related Background Art

As conventionally known in the art, amorphous silicon can form large-area semiconductor devices relatively with ease compared with crystalline silicon and polycrystalline silicon, because large-area semiconductor films can be produced by plasma CVD (chemical vapor deposition). Accordingly, amorphous silicon films are widely used in semiconductor devices required to have a large area as exemplified by photovoltaic devices for solar cells, photosensitive drums for copying machines, image sensors for facsimile machines and thin-film transistors for liquid-crystal display devices.

These devices have a larger area for each device than devices formed of crystalline semiconductors such as LSIs and CCDs. For example, in the case of solar cells, when having a conversion efficiency of 10%, they must have an area of as large as about 30 square meters per home in order to obtain an output of about 3 kW for supplying electric power consumed in ordinary homes. Thus, each photovoltaic device constituting the solar cells is required to have a reasonably large area.

In the case where the amorphous silicon films are formed, plasma CVD is widely used, which is a process comprising decomposing into plasma a material gas containing, e.g., $SiH_4$ or $Si_2H_6$, and forming an amorphous silicon film on a substrate provided in the plasma.

As a system for continuously producing amorphous silicon semiconductor devices by such plasma CVD, a continuous plasma CVD system employing a roll-to-roll arrangement is widely known, which is disclosed in, e.g., U.S. Pat. No. 4,400,409.

This system has a plurality of glow discharge chambers in a row and each glow discharge chamber has a through course, where a sufficiently long beltlike substrate having a desired width is disposed through the inside of each glow discharge chamber and along the course in which it passes sequentially through the insides of the glow discharge chambers, and the beltlike substrate is continuously transported in the lengthwise direction while semiconductor films having the desired conductivity types are formed on the substrate in the glow discharge chambers, thus various semiconductor films can be formed in layers in the specific regions of the substrate. As a result, large-area devices having semiconductor junction can be formed continuously.

Use of such a roll-to-roll type continuous plasma CVD system enables long-time continuous production of devices without stopping the production system.

Now, in the roll-to-roll type system constructed as described above or in a system for forming deposited films on the surface of a substrate which is not beltlike, the present inventors attempted to change frequencies so that discharge can be caused to take place in higher frequency regions. As a result, they have become aware that the following difficulty occurs.

That is, large-area planar electrodes commonly used in a frequency region of about 13.56 MHz make it difficult to form a large-area and uniform plasma because the impedances can not be adjusted or can be matched with difficulty for causing discharge to take place in a higher frequency region. Such a technical problem has been found.

In order to solve this problem, a method is devised in which an antenna-shaped discharge electrode is used in place of the planar electrode to cause plasma to take place. This method brings about advantages that electric power concentrates to the antenna-shaped discharge electrode to readily cause discharge to take place and also improve deposition rate. It, however, has been found that a difficulty occurs on the other hand, such that, when discharged for a long time by this method, the power feeding course through which an electric power is fed to the antenna-shaped discharge electrode comes to have a high temperature to cause a great applied-power loss. As a result, when discharged continuously for a longer time, the discharge may become non-uniform to cause changes with time in the film thickness and film properties of deposited films formed, bringing about another problem that defects may occur to lower the yield of products.

There is a conventional apparatus in which the antenna portion extending in the discharge space is cooled. Since, however, the whole power feeding course can not be cooled by only this means, sufficient temperature control has not been achieved.

The present inventors made extensive studies on the cause of these problems. As a result, they have considered that the problems are due to a dielectric loss caused by applied power when an electric power is applied to the film forming space of the plasma CVD system, or due to the fact that the power feeding course leading to the antenna-shaped discharge electrode comes to have a high temperature as a result of the latter's exposure to the plasma in the film forming space. Here, where a dielectric material so disposed as to surround the power feeding course is integrally provided, its power supply conductor conducts the heat in a large quantity from the discharge electrode and inevitably heats a power source section connected to the power supply conductor and even a container through the wall of which the power supply conductor is provided. Thus, on the basis of this consideration, the present inventors have solved the above problems and have accomplished the present invention as described below.

SUMMARY OF THE INVENTION

An object of the present invention is to provide a deposited film forming system and a deposited film forming process which are able to make applied-power loss occur less, to keep the power feeding course from its temperature rise, to make discharge readily take place even after use for a long time and also to maintain uniform discharge for a long time. Stated more specifically, an object of the present invention is to provide a system, and a process, by which deposited films having a high quality and a superior uniformity can be formed over a large area on a beltlike substrate that moves continuously.

To achieve the above object, the present invention provides a deposited film forming system having at least a vacuum vessel, means for feeding a film-forming material gas into the vacuum vessel, a discharge electrode provided inside the vacuum vessel, used to make the material gas into a plasma, and a power supply conductor for applying a high-frequency power to the discharge electrode; the system comprising:

an earth shield so disposed as to surround the power supply conductor inside the vacuum vessel; and a plurality of dielectric materials at least part of which is disposed between the power supply conductor and the earth shield.

The present invention also provides a deposited film forming process comprising the steps of:

feeding a film-forming material gas into a vacuum vessel provided with a discharge electrode inside the vessel; and applying a high-frequency power through a power supply conductor for applying the high-frequency power to the discharge electrode to make the material gas into a plasma, to form a deposited film on a substrate provided inside the vacuum vessel;

the high-frequency power being fed to the discharge electrode through the power supply conductor, by the aid of;

an earth shield so disposed as to surround the power supply conductor inside the vacuum vessel; and a plurality of dielectric materials at least part of which is disposed between the power supply conductor and the earth shield.

The present invention still also provides a deposited film forming system having at least a vacuum vessel, means for feeding a film-forming material gas into the vacuum vessel, a discharge electrode provided inside the vacuum vessel, used to make the material gas into a plasma, and a power supply conductor for applying a high-frequency power to the discharge electrode; the system comprising:

an earth shield so disposed as to surround the power supply conductor inside the vacuum vessel;

a plurality of dielectric materials at least part of which is disposed between the power supply conductor and the earth shield; and cooling means for cooling the dielectric material.

The present invention further provides a deposited film forming process comprising the steps of:

feeding a film-forming material gas into a vacuum vessel provided with a discharge electrode inside the vessel; and applying a high-frequency power through a power supply conductor for applying the high-frequency power to the discharge electrode to make the material gas into a plasma, to form a deposited film on a substrate provided inside the vacuum vessel;

the high-frequency power being fed to the discharge electrode through the power supply conductor, by the aid of;

an earth shield so disposed as to surround the power supply conductor inside the vacuum vessel;

a plurality of dielectric materials at least part of which is disposed between the power supply conductor and the earth shield; and cooling means for cooling the dielectric material;

the high-frequency power being fed while cooling the dielectric material by the cooling means.

The present invention still further provides a deposited film forming system having at least a vacuum vessel, means for feeding a film-forming material gas into the vacuum vessel, a discharge electrode provided inside the vacuum vessel, used to make the material gas into a plasma, and a power supply conductor for applying a high-frequency power to the discharge electrode; the system comprising:

an earth shield so disposed as to surround the power supply conductor inside the vacuum vessel;

a dielectric material disposed between the power supply conductor and the earth shield; and cooling means for cooling the dielectric material.

The present invention further provides a deposited film forming process comprising the steps of:

feeding a film-forming material gas into a vacuum vessel provided with a discharge electrode inside the vessel; and applying a high-frequency power through a power supply conductor for applying the high-frequency power to the discharge electrode to make the material gas into a plasma, to form a deposited film on a substrate provided inside the vacuum vessel;

the high-frequency power being fed to the discharge electrode through the power supply conductor, by the aid of;

an earth shield so disposed as to surround the power supply conductor inside the vacuum vessel;

a dielectric material disposed between the power supply conductor and the earth shield; and cooling means for cooling the dielectric material;

the high-frequency power being fed while cooling the dielectric material by the cooling means.

In the deposited film forming system of the present invention, the dielectric material at least part of which surrounds the power supply conductor is provided in plurality, and hence the heat generated in the discharge space can be shut out and the power supply conductor can be prevented from being heated, so that the power supply conductor can be kept from causing power loss.

In the deposited film forming system of the present invention, the cooling means, which surrounds the dielectric material, can also cool the dielectric material heated by the heat coming from the discharge space, and hence the heat generated in the discharge space can be shut out and the power supply conductor can be prevented from being heated, so that the power supply conductor can be kept from causing power loss.

DESCRIPTION OF THE PREFERRED EMBODIMENTS

The present invention will be described below with reference to the accompanying drawings.

Figure 1:
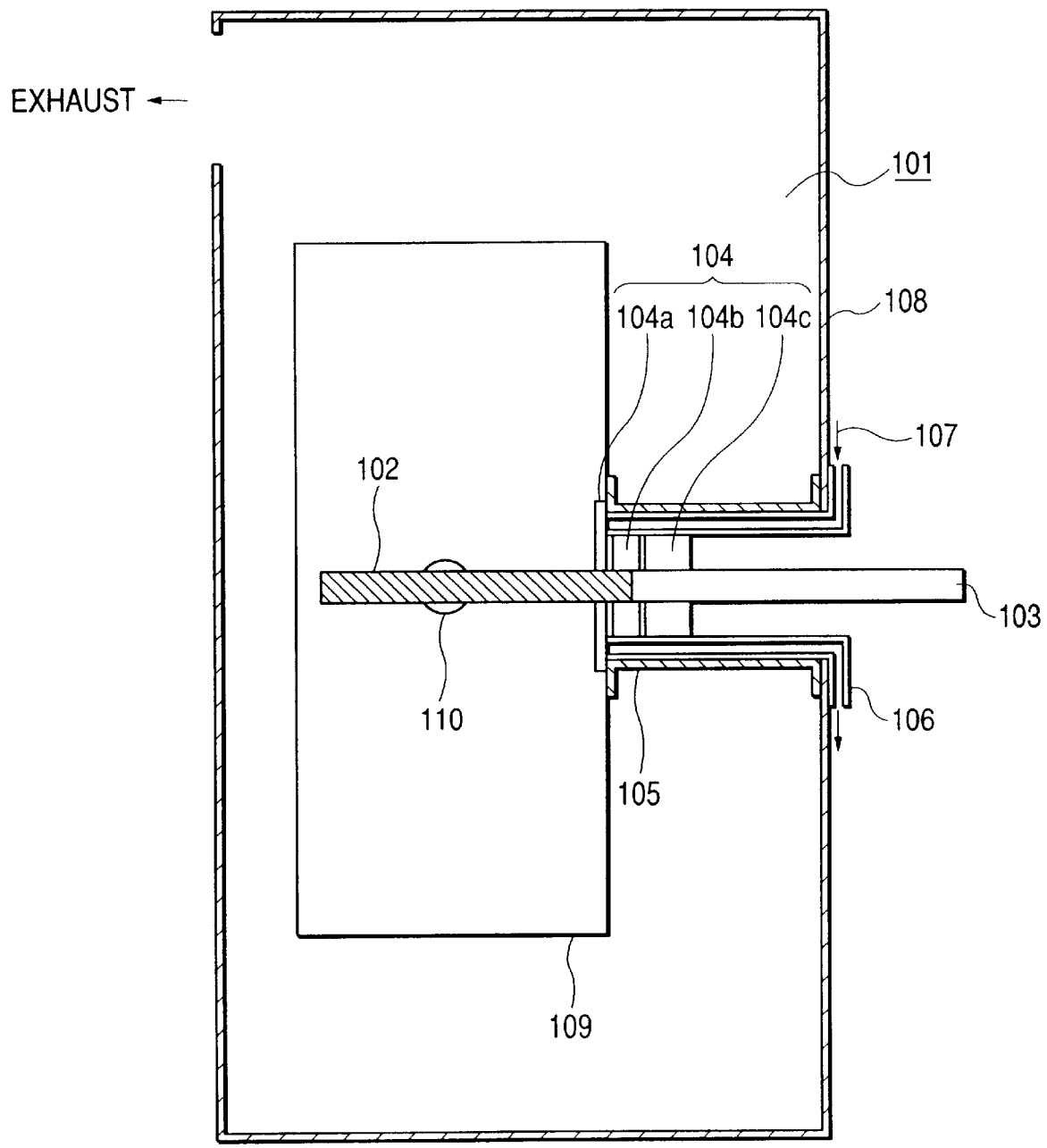
FIG. 1 is a diagrammatic cross-sectional illustration of an example of a deposited film forming system having a power feeding course according to an embodiment of the present invention.

FIG. 1 is a diagrammatic cross-sectional illustration of a preferred example of the deposited film forming system of the present invention. As shown in FIG. 1, a deposited film forming system 101 has a vacuum vessel 108, a discharge vessel 109, an antenna-shaped discharge electrode 102, a power supply conductor 103, an earth shield 105, dielectric materials 104a, 104b and 104c (hereinafter often "dielectric material 104" as a whole), and optionally a cooling means 106.

The discharge vessel 109 is provided in the internal space of the vacuum vessel 108. The vacuum vessel 108 is connected with an exhaust means (not shown), and its inside can be evacuated into a vacuum state. The discharge vessel 109 also confines the discharge within the discharge vessel itself and part of its wall is opened (not shown) to the vacuum vessel 108 so that the inside of the discharge vessel 109 is also evacuated as the inside of the vacuum vessel 108 is brought into a vacuum state. Also, one plane of the discharge vessel 109 stands open on the side of paper surface as viewed on FIG. 1.

A processing target to be processed by discharging, more specifically a substrate, is not shown in FIG. 1. The substrate is held inside the vacuum vessel 108, and is so disposed as to face, with a distance, the discharge vessel 109 holding therein the antenna-shaped discharge electrode 102. More specifically, the substrate is placed in parallel to the discharge vessel 109 on its plane where the leader line 109 is drawn in FIG. 1, i.e., the plane standing open as described above, and in such a way that the substrate blocks up this plane and faces this plane with a distance, without any obstruction between this plane and the antenna-shaped discharge electrode 102. Namely, no wall of the discharge vessel 109 is provided between the antenna-shaped discharge electrode 102 and the position where the substrate is placed. In other words, the substrate is so disposed as to constitute one wall surface of the discharge vessel 109.

The antenna-shaped discharge electrode 102 has the shape of a rod, and its one end is connected with the power supply conductor 103. The power supply conductor 103 is so provided as to pass through a wall of the vacuum vessel 108, and the antenna-shaped discharge electrode 102 and power supply conductor 103 connected with each other are provided through an opening of the discharge vessel 109 in such a way that at least the antenna-shaped discharge electrode 102 can be disposed inside the discharge vessel 109.

The discharge vessel 109 has a gas inlet 110. In the system shown in FIG. 1, the gas inlet 110 is a round small hole provided in a wall of the discharge vessel 109, and in the drawing only part of its contour is illustrated since the antenna-shaped discharge electrode 102 is provided on this side of the gas inlet 110 as viewed in the drawing. This gas inlet 110 is a small hole through which a material gas such as silane gas is fed into the discharge vessel 109 in, e.g., plasma CVD.

The dielectric material 104 is so provided that at least part thereof surrounds the power supply conductor 103 at the space where the discharge vessel 109 and the vacuum vessel 108 face each other. This dielectric material 104 is so provided as to stop up the gap between the perimeter of the discharge vessel 109 opening described above and the power supply conductor 103 to ensure air-tightness.

The deposited film forming system shown in FIG. 1 has a structure wherein at least part of the dielectric materials 104a, 104b and 104c is provided between the antenna-shaped discharge electrode 102 and the earth shield 105, where $Al_2O_3$ ceramic as the dielectric material 104a, BN ceramic as the dielectric material 104b and polytetrafluoroethylene as the dielectric material 104c are provided side by side in this order, leaving gaps of 0.5 mm between them; the one 104a being provided at the part laid bare to the discharge space produced inside the vacuum vessel 108. Also, the gaps between the dielectric materials are evacuated when the discharge space is evacuated. As a result, the gaps thus evacuated have the effect of heat insulation.

Around at least part of the dielectric material 104, the earth shield 105 is provided. The earth shield 105 makes the applied power transmissible to the antenna-shaped discharge electrode 102 in a good efficiency. Since it is provided around at least part of the dielectric materials 104a, 104b and 104c, it is so disposed as to surround the power supply conductor 103, too. Also, the cooling means 106 is optionally so provided as to surround the outside of at least part of the dielectric material 104, and a refrigerant 107 for cooling the dielectric material 104 is flowed into the cooling means, having a circular flow path.

In the system shown in FIG. 1, the earth shield 105 is so provided as to surround the power supply conductor 103 inside the vacuum vessel 108 and at least part of the dielectric material 104 is further so provided as to surround the power supply conductor 103 between the earth shield 105 and the power supply conductor 103, as shown in the drawing. More specifically, the system is so constructed that a power feeding course which is constituted of the earth shield 105, the power supply conductor 103 and the dielectric material 104 and through which a high-frequency power is applied to the antenna-shaped discharge electrode 102 protrudes from the inner wall of the vacuum vessel 108. Thus, the corresponding wall of the discharge vessel 109 can stand separate from the vacuum vessel 108, and hence any dust or the like produced inside the discharge vessel 109 can be prevented from adhering to the walls of the vacuum vessel 108. In addition, when the discharge vessel 109 is constructed detachably from the vacuum vessel 108, the discharge vessel 109 to which the dust has adhered can be detached from the vacuum vessel 108 to remove the dust with ease.

As described above, the deposited film forming system 101 shown in FIG. 1 is constituted of (1) the antenna-shaped discharge electrode 102 and the power supply conductor 103, (2) the earth shield 105 and (4) the dielectric material 104. The respective constituents will be detailed below.

(1) Antenna-shaped Discharge Electrode and Power Supply Conductor:

In the present invention, the high-frequency power is introduced to the antenna-shaped discharge electrode (high-frequency power feed means) 102 disposed in the discharge vessel 109 whose inside has been evacuated, through the power supply conductor 103 provided outside the discharge vessel 109. The power supply conductor 103 may be comprised of a coaxial cable or the like. With regard to the distance between the antenna-shaped discharge electrode 102 and the substrate (not shown) and the distance between the antenna-shaped discharge electrode 102 and the wall surface of the discharge vessel 109, these may preferably be disposed at distances that may cause no abnormal discharge in relation to discharge pressure. As the frequency of the electric power to be applied, it may appropriately be selected from frequency bands ranging from RF to microwave frequencies. A relatively high frequency may be selected when plasma density must be made higher to attain a higher deposition rate, and a relatively low frequency, having a longer wavelength, may be selected when it is desired to make uniformity higher. In the deposited film forming system and process according to the present invention, the frequency may preferably be selected within the range of from 13.56 MHz to 2.45 GHz. It may more preferably be selected within the range of from 20 MHz to 500 MHz because deposition rate can be made higher and stable deposited films can be formed.

The antenna shape of the discharge electrode 102 may preferably be of a structure wherein the radiation of high-frequency power takes place smoothly and electric fields may less concentrate on the radiation surface. The discharge electrode 102 may be made of a material selected from those having a good plasma resistance and good radiation properties. For example, a stainless steel material may be used as it is, promising sufficiency in view of both strength and plasma resistance. In order to improve radiation efficiency, the stainless steel material may be plated with, e.g., Ni or Ag to improve electrical conductivity.

(2) Earth Shield:

The earth shield 105 is provided around the transmission path of high-frequency power so that the high-frequency power supplied from a high-frequency power source (not shown) can be transmitted to the antenna-shaped discharge electrode 102 in a good efficiency. Accordingly, a non-magnetic conductor is suitable as a material constituting the earth shield 105.

(3) Dielectric Material:

Since at least part of the dielectric material 104 is so disposed as to surround the periphery of the power supply conductor 103, materials having good thermal conductivity, vacuum characteristics, strength, mechanical workability, electrical insulation properties, heat resistance, low dielectric constant and so forth are preferable for the dielectric material 104. In particular, ceramics having these properties together are preferred, as exemplified by $Al_2O_3$, BN, AlN, MgO, $Si_3N_4$, TiO, and composite sintered products of these. Materials composed chiefly of any of these ceramics and incorporated with C, Al, Fe, Mg, $B_2O_3$ or CaO may also be used.

Polymeric materials containing TFE (tetrafluoroethylene) copolymers rich in heat resistance, electrical insulation properties and mechanical workability, or polyimides (available from Du Pont) and epoxy resins may also be used as dielectric materials.

The dielectric material 104 may, as shown in FIG. 1, be constituted of a plurality of constituents such as a first dielectric material (corresponding to the dielectric material 104a) provided at the part laid bare to the discharge space produced inside the vacuum vessel 108 and a second dielectric material (inclusive of the dielectric materials 104b and 104c in FIG. 1) provided at the part not laid bare to the discharge space. When constituted in this way, the first dielectric material, which is exposed to plasma and is known to become high-temperature, may preferably be a material having good heat resistance and thermal conductivity and also having less temperature dependence of the thermal conductivity. On the other hand, the second dielectric material, which surrounds the power supply conductor 103 and is required to restrain the loss of applied power, may preferably be a material having a small dielectric loss. A gap may be left between the first dielectric material and the second dielectric material. When thus constructed, the insulation of the power supply conductor 103 from the earth shield 105 can be improved. Number of the dielectric material may be three as shown in FIG. 1 and still more dielectric materials may also be provided.

Figure 2:
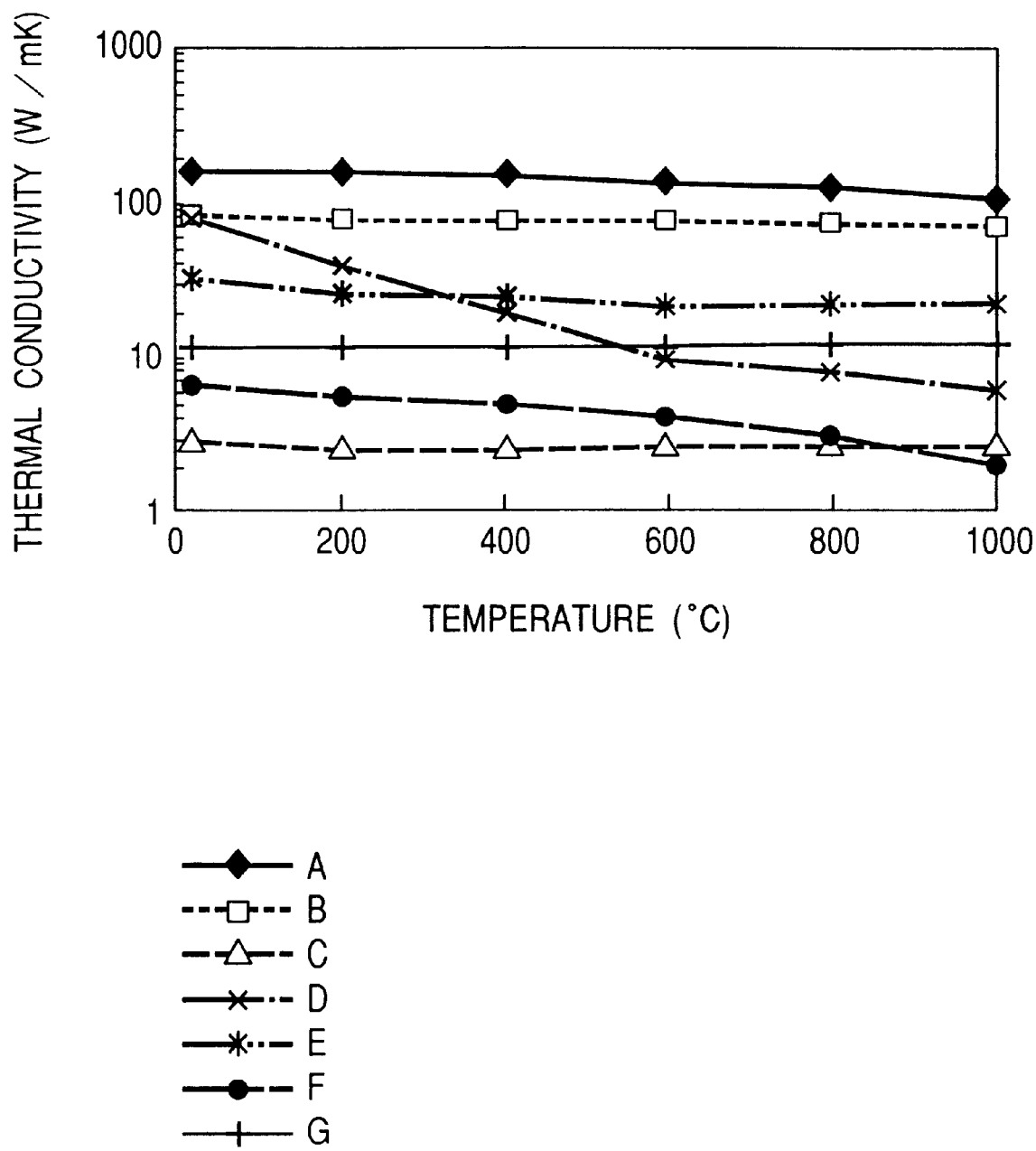
FIG. 2 is a graph showing thermal conductivity with respect to temperature, of various dielectric materials.

FIG. 2 is a graph showing an example of thermal conductivity with respect to temperature, of various dielectric materials. Using materials A to G having such different temperature dependences of thermal conductivity, thin films were deposited on beltlike members using 100 sccm of $SiH_4$ and 500 sccm of $H_2$ at a high-frequency power of 700 W (frequency: 100 MHz), a pressure of 20 mTorr and a substrate temperature of 350° C. The thin films thus formed on the beltlike members were cut out at intervals of 10 m to examine their film thickness distributions. Results obtained are shown in Table 1 together. Here, the film thickness distribution shown in Table 1 corresponds to a percentage obtained when the film thickness measured on each position on the substrate is divided by average film thickness.

As can be seen from the results shown in Table 1, among the dielectric materials A to G, those having a thermal conductivity (W/mK) of 12 W/mK or more are A, B, D, E and G. Of these, however, D has a film thickness distribution of ±15% even though having a thermal conductivity of 80 W/mK, thus the film thickness distribution is larger than 10%. This is due to a great temperature dependence of D. The relationship between thermal conductivity and temperature of each of the dielectric materials A to G is shown in the graph of FIG. 2. As can be seen from the graph, D has a greater temperature dependence than the other dielectric materials and shows a rate of change which is larger than the half. As a result, D has a large film thickness distribution. Thus, it has been found that, in order to control the film thickness distribution to be 10% or less, dielectric materials having a thermal conductivity of 12 W/mK or higher and also having a small temperature dependence of thermal conductivity, i.e., dielectric materials showing a rate of change which is not larger than the half are suited for the first dielectric material used in the present invention. In short, among dielectric materials A to G, A, B and C are preferred materials.

As for the second dielectric material, its temperature rises as a result of loss of the applied power fed from the power supply conductor 103 to the antenna-shaped discharge electrode 102. Hence, it is important to select materials having a small dielectric loss ($\epsilon$ tan $\delta$). Accordingly, using dielectric materials H, I, J, K, L, M, N, O and P having various dielectric loss as shown in Table 2, films were formed on beltlike members under the same conditions as those shown previously and their film thickness distributions were measured in the same manner. Results obtained are shown in Table 2 together.

As can be seen from Table 2, in order to control the film thickness distribution to be 10% or less, dielectric materials having a dielectric loss ($\epsilon$ tan $\delta$) of $2\times10^{-2}$ or below are suited for the second dielectric material used in the present invention.

Of the dielectric materials described above, the AlN ceramic is characterized by having mechanical workability, thermal conductivity, mechanical strength, electrical insulation properties, low coefficient of thermal expansion and low dielectric loss, and is preferred as the first dielectric material used in the present invention.

The $Al_2O_3$ ceramic has a good mechanical strength and also good heat resistance, thermal conductivity, electrical insulation properties and dielectric loss, and is most preferred as the first and second dielectric materials used in the present invention.

The BN ceramic has a rich mechanical workability among the ceramics, and has good electrical and thermal properties and low power loss. The polytetrafluoroethylene has a good heat resistance among the polymeric materials and a rich vacuum sealability and is also a low dielectric loss material. Thus, these are most preferred as the second dielectric material used in the present invention.

As can be seen also from the features of these dielectric materials, only one kind of dielectric material may be disposed between the power supply conductor 103 and the earth shield 105, but, rather than it, roles may be allotted to a plurality of dielectric materials. That is, the first and second dielectric materials may be provided side by side, leaving a gap at the interface between them. This is effective for temperature control of the power feeding course and furthermore for discharge stability.

The first dielectric material facing the discharge space also plays a role as an antenna shield. The antenna shield is required to have the function to make uniform any gap between facing surfaces nearest to the antenna in the power feeding course, to prevent abnormal discharge. Meanwhile, the first dielectric material faces the discharge space and hence is desired to be a material withstanding the plasma when exposed thereto. The first dielectric material may further be provided with unevenness on its surface on the side facing the discharge space, chiefly for the purposes of preventing deposited films from coming off and preventing short-circuit current which may occur because the antenna-to-earth positioning is on the same plane.

The cooling means 106 may further be provided for the dielectric material 104. A refrigerant 107 comprised of a gas or a liquid may be circulated through the inside of the cooling means 106 to cool the dielectric material 104 so that the dielectric material 104 can be more prevented from its temperature rise during power supply. Such an embodiment may be used. As the structure of the cooling means 106, it may preferably have any structure that enables the dielectric material 104 to be cooled in a good efficiency, as exemplified by hollow structure, honeycomb structure, and insulating pipe built-in structure. It may preferably have structure which allows the refrigerant 107 to pass near to the dielectric material 104 as far as possible and also has a good strength. As the refrigerant 107 flowed inside the cooling means 106, a gas or a liquid may be used. The gas may preferably be, e.g., air, and besides an inert gas commonly used, such as nitrogen, argon or helium. In the case of a liquid, it may preferably be, e.g., water or a lower alcohol such as glycol. Also, the cooling means 106 may be provided between the earth shield 105 and the dielectric material 104.

Figure 3:
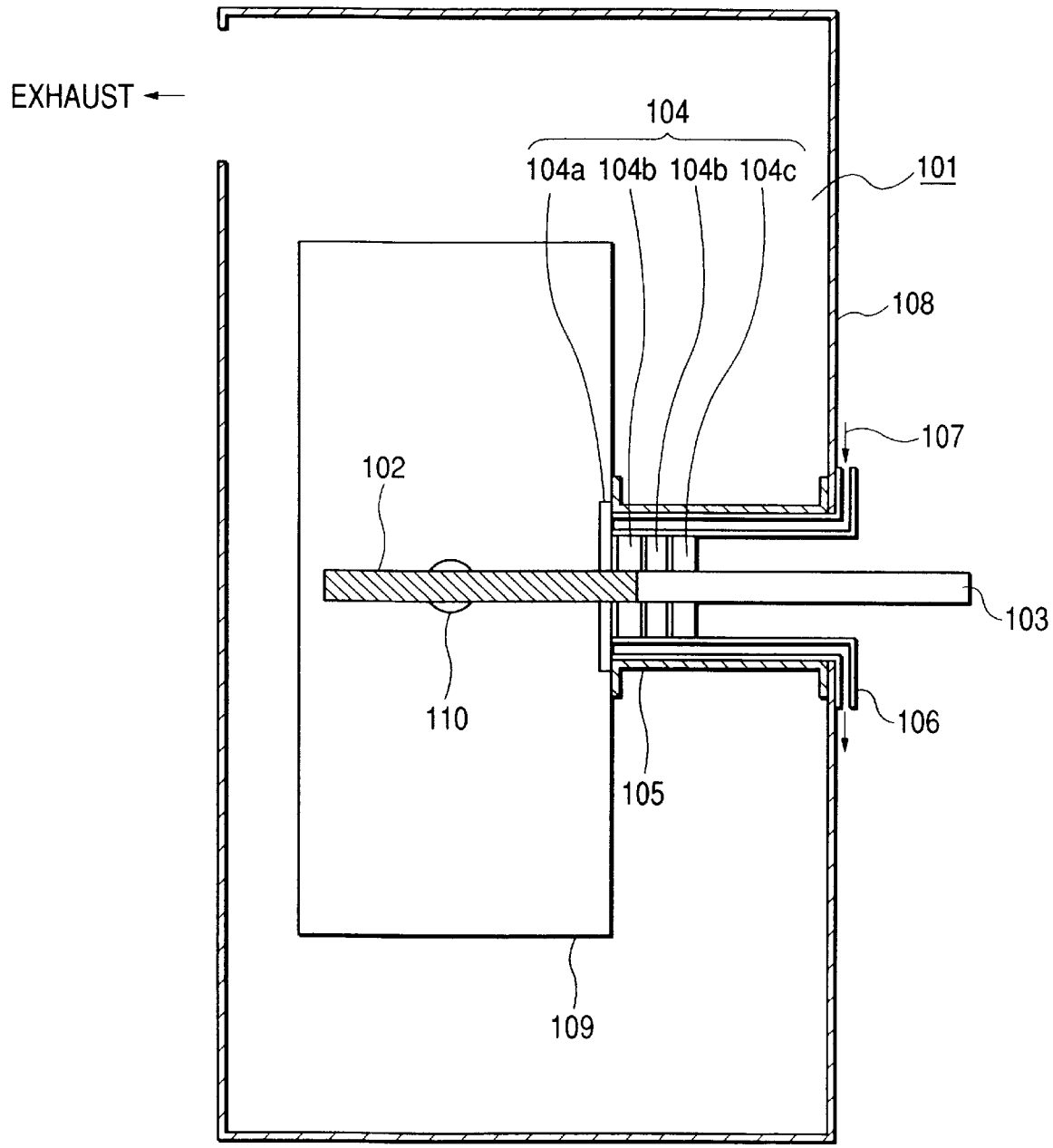
FIG. 3 is a diagrammatic cross-sectional illustration of another example of the deposited film forming system having a power feeding course according to an embodiment of the present invention.

In the deposited film forming system of the present invention, as an embodiment different from the foregoing, the dielectric material 104b among the dielectric materials 104a, 104b and 104c may be constituted of a plurality of, stated more specifically, two dielectric materials of the same material which are provided apart from each other as shown in FIG. 3.

Incidentally, any one of dielectric material of the dielectric materials 104a and 104c may likewise be constituted of a plurality of dielectric materials of the same material which are provided apart from each other.

In the deposited film forming system of the present invention, as being different from the foregoing, the shape of the hole provided in the discharge vessel 109 need not be circular, and may be, e.g., polygonal. Also, the number of the hole may be two or more.

Figure 4:
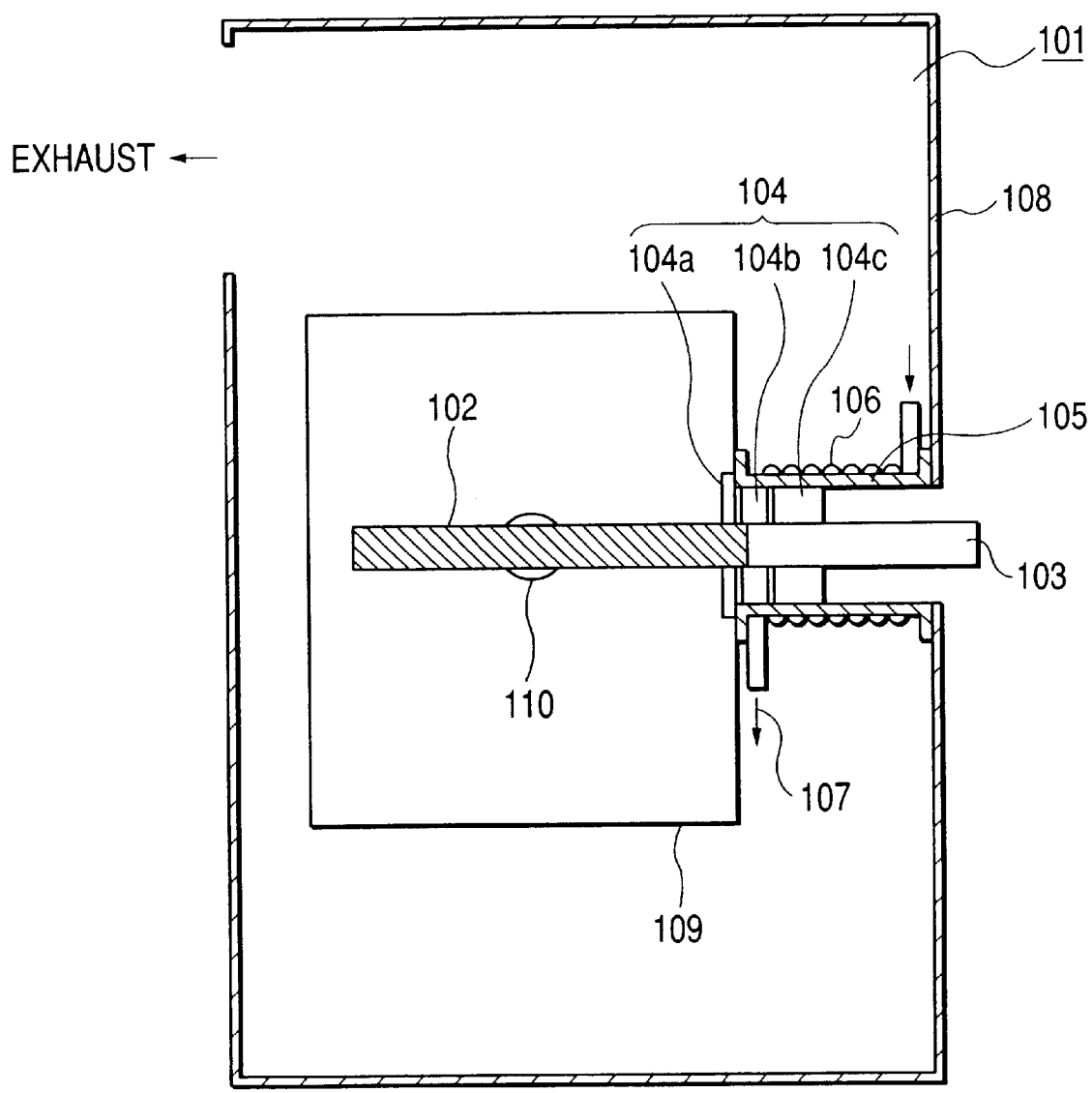
FIG. 4 is a diagrammatic cross-sectional illustration of still another example of the deposited film forming system having a power feeding course according to an embodiment of the present invention.

The cooling means 106 may have a helical shape on the whole as shown in FIG. 4. More specifically, the cooling means 106 is, in its region through which the refrigerant is passed, helically provided around the earth shield 105. In that region, the cooling means 106 has a part from which the refrigerant is introduced and a part from which it is emitted. The cooling means 106 is so provided as to surround the periphery of the dielectric material 104. In FIG. 4, the region through which the refrigerant of the cooling means 106 is passed is cross-sectionally illustrated.

In that region, the cooling means 106 is tubular. The refrigerant 107 comprised of a gas or a liquid can be held in the tube, and may optionally be put into the cooling means 106 so as to be passed therethrough and sent outside the periphery of the dielectric material 104 as shown in FIG. 4.

The position at which the refrigerant is introduced is a position distant from the discharge vessel 109, i.e., a position of the part having relatively a low temperature in the dielectric material 104. Also, the position at which the refrigerant is emitted out of the periphery of the dielectric material 104 is a position close to the discharge vessel 109, i.e., a position of the part having relatively a high temperature in the dielectric material 104. Such positioning is preferred in view of an advantage that the dielectric material 104, having a high temperature, can be prevented from being suddenly cooled to break.

EXAMPLES

The present invention will further be described below by giving Examples. The present invention is by no means limited by these Examples.

Example 1

Figure 7:
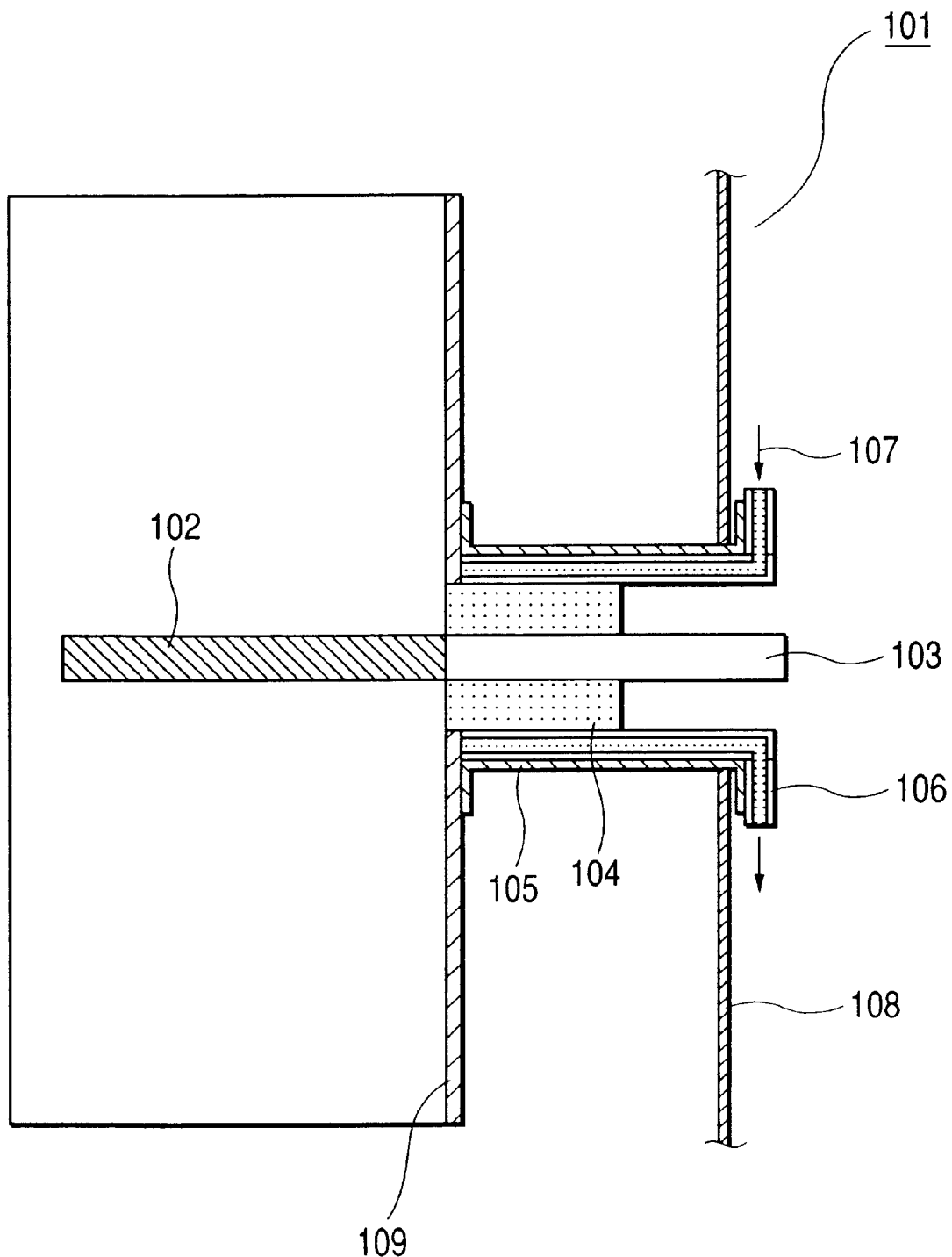
FIG. 7 is a diagrammatic cross-sectional illustration of still another example of the deposited film forming system having a power feeding course, used in Examples of the present invention.

FIG. 7 is a diagrammatic cross-sectional illustration of a deposited film forming system having a power feeding course according to Example 1. As shown in FIG. 7, a cooling means 106 is so provided as to surround the periphery of a dielectric material 104. Reference numeral 101 denotes a deposited film forming system; 102, an antenna-shaped discharge electrode; 103, a power supply conductor; 104, the dielectric material; 105, an earth shield; 106, a cooling means; 107, the direction in which a refrigerant moves; and 108, part of the wall of an exhaust vessel. In this system, the dielectric material 104 may be provided in singularity as shown in FIG. 7 or in plurality as described previously, to surround the power supply conductor 103.

Figure 5:
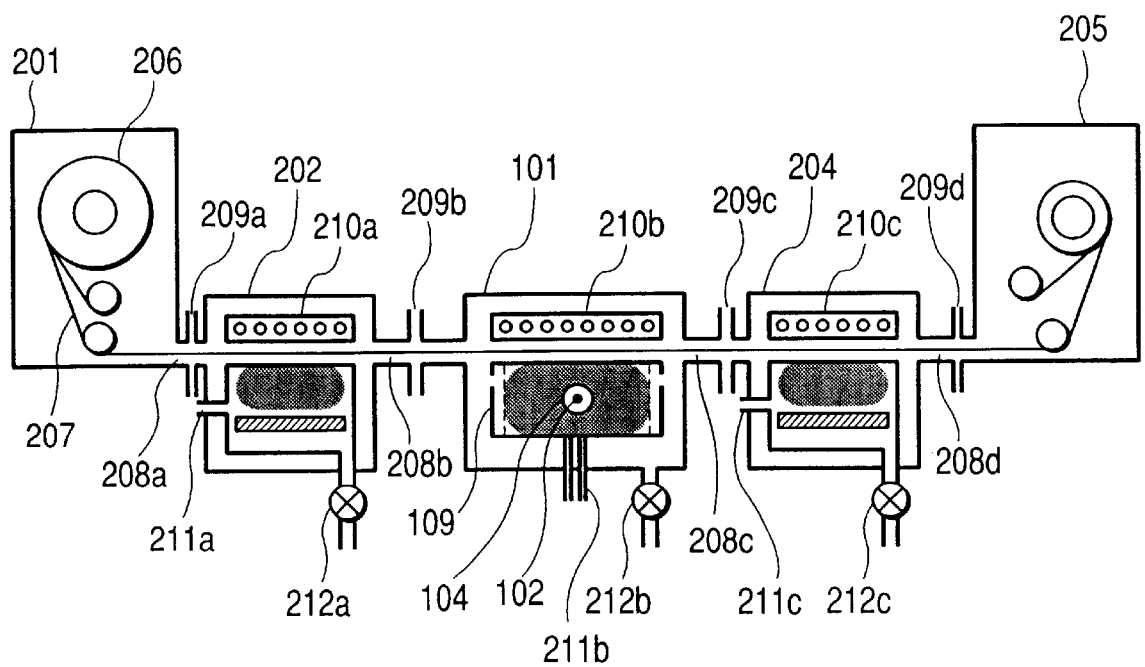
FIG. 5 is a diagrammatic cross-sectional illustration of a roll-to-roll type continuous plasma CVD system in which a deposited film forming system having a power feeding course according to the present invention is used as an i-type layer film forming system.

In the present Example, the deposited film forming system 101 having the power feeding course as shown in FIG. 7 was modified so as to be used as an i-type layer forming system (constituting a deposition chamber 101) in a roll-to-roll type continuous plasma CVD system shown in FIG. 5. Using this system, a single-type photovoltaic device was continuously produced on a substrate comprised of a beltlike member. Here, the power feeding course provided in the i-type layer forming system (deposition chamber 101) was constituted of an antenna-shaped discharge electrode 102 formed chiefly of Ni and a dielectric material 104 made to comprise two types AlN and BN provided side by side. Water was circulated as the refrigerant 107 in the cooling means 106 to cool the dielectric material 104. The two types of dielectric materials are provided apart from each other.

The photovoltaic device was produced according to the procedure described below in detail.

(1) First, a bobbin 206 wound up with a beltlike member 207 made of SUS30BA stainless steel (300 mm wide, 200 m long and 0.13 mm thick) having been well degreased and cleaned and on which a silver thin film of 100 nm thick and a ZnO thin film of 1 $\mu$m thick had been vacuum-deposited as a lower electrode by sputtering was set in a vacuum chamber 201 having a substrate feed mechanism, shown in FIG. 5. The beltlike member 207 was passed through a gas gate 208a, a deposition chamber 202 for forming a first conductivity type layer, a gas gate 208b, the deposition chamber 101 for forming an i-type layer, a gas gate 208c, a deposition chamber 204 for forming a second conductivity type layer and a gas gate 208d, up to a vacuum chamber 205 having a beltlike member winding mechanism, and its tension was adjusted so that the beltlike member was not slack.

(2) Thereafter, the vacuum chambers or deposition chambers 201, 202, 101, 204 and 205 were evacuated to a vacuum of $1 \times 10^{-4}$ Torr or below by means of a vacuum pump (not shown).

(3) Next, 700 sccm each of $H_2$ as gate gas was flowed into gas gates 208a to 208d through gate gas feed pipes 209a to 209d, and the beltlike member 207 was heated to 350° C. by means of heating infrared lamps 210a to 210c.

(4) Next, 160 sccm of $SiH_4$ gas, 120 sccm of $PH_3/H_2$ gas (P concentration: 2%) and 700 sccm of $H_2$ gas were fed into the deposition chamber 202 through a gas feed means 211a. Also, 100 sccm of $SiH_4$ gas and 500 sccm of $H_2$ gas were fed into the deposition chamber 101 through a gas feed means 211b. Still also, 10 sccm of $SiH_4$ gas, 250 sccm of $BF_3/H_2$ gas ($BF_3$ concentration: 2%) and 1,000 sccm of $H_2$ gas were fed into the deposition chamber 204 through a gas feed means 211C. After the gases were thus fed into the chambers, the pressure inside the deposition chambers 202 and 204 were adjusted to 1.02 Torr by controlling the aperture of throttle valves 212a and 212c while watching a pressure gauge (not shown). The pressure inside the deposition chamber 101 was adjusted to 16 mTorr by controlling the aperture of a throttle valve 212b while watching a pressure gauge (not shown).

(5) Thereafter, an electric power with a frequency of 13.56 MHz and an electric power with a frequency of 100 MHz were supplied into the deposition chambers 202 and 204 and the deposition chamber 101, respectively.

(6) Next, the beltlike member 207 was set being transported to form the first conductivity type layer, i-type layer and second conductivity type layer in this order on the beltlike member.

(7) Next, cells on which films were continuously superposed in this way were cut out. On each second conductivity type layer thereof, ITO ($In_2O_3+SnO_2$) was deposited by vacuum deposition in a thickness of 70 nm as a transparent electrode and Al was deposited by vacuum deposition in a thickness of 2 $\mu$m as a collector electrode. Thus, photovoltaic devices (Device No. Ex. 1) were produced.

Conditions for producing the above photovoltaic devices (Device No. Ex. 1) are summarized in Table 3.

Comparative Example 1

Figure 6:
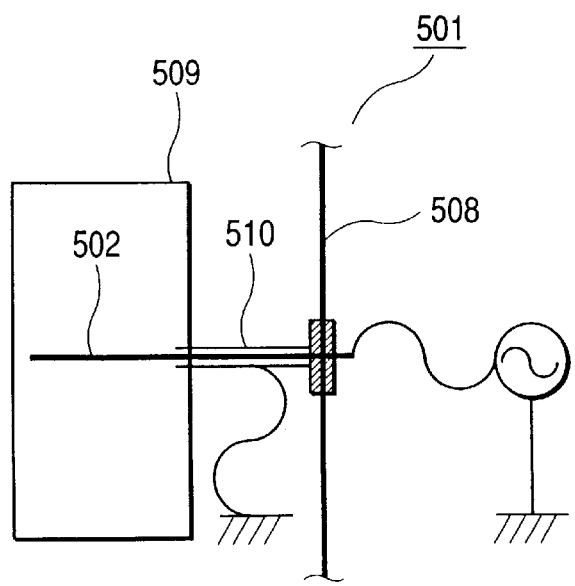
FIG. 6 is a diagrammatic cross-sectional illustration of an example of a deposited film forming system having a power feeding course, used in Comparative Examples of the present invention.

The present Comparative Example is different from Example 1 in that, in place of the deposited film forming system having the power feeding course as shown in FIG. 7, a deposited film forming system having a power feeding course as shown in FIG. 6 was used as the i-type layer forming system 101. The power feeding course shown in FIG. 6 has a structure wherein any dielectric material is not provided between an antenna-shaped discharge electrode (502) and an earth shield (510). In FIG. 6, reference numeral 501 denotes the deposited film forming system; 502, the antenna-shaped discharge electrode; 508, part of the wall of a vacuum vessel; 509, a discharge vessel; and 510, the earth shield 105.

Under the same conditions as in Example 1 except the foregoing, a single-type photovoltaic device was continuously produced on a substrate comprised of a beltlike member, using the roll-to-roll type continuous plasma CVD system shown in FIG. 5. Thus, photovoltaic devices (Device No. Cp. 1) were produced.

On the photovoltaic devices (Device No. Ex. 1) produced in Example 1 and the photovoltaic devices (Device No. Cp. 1) produced in Comparative Example 1, their uniformity of characteristics, and yield, were evaluated.

The uniformity of characteristics was evaluated by examining changes with time of photoelectric conversion efficiency of the photovoltaic devices (Device No. Ex. 1 and Device No. Cp. 1), which were both cut out at intervals of 10 m in a size of 5 cm square each and placed under irradiation by light of AM 1.5 (100 mW/cm$^2$) to measure their photoelectric conversion efficiency.

The changes with time of characteristics, and yield, of the photovoltaic devices (Device No. Ex. 1 and Device No. Cp. 1) are shown in Table 4. Here, the changes with time of characteristics as shown in Table 4 are results obtained when reciprocals of the magnitude of changes with time of photoelectric conversion efficiency of the respective photovoltaic devices (Device No. Ex. 1 and Device No. Cp. 1) are found on the basis of the value of the photovoltaic devices (Device No. Cp. 1) produced in Comparative Example 1.

As can be seen from Table 4, the photovoltaic devices (Device No. Ex. 1) of Example 1 are superior to the photovoltaic devices (Device No. Cp. 1) of Comparative Example 1 in both the uniformity of characteristics and the yield. It was also ascertained that the power feeding course used in the production of the photovoltaic devices (Device No. Cp. 1) of Comparative Example 1 came to have a high temperature and, during discharge, caused an unstable state, e.g., discharge flickering, whereas the power feeding course used in the production of the photovoltaic devices (Device No. Ex. 1) of Example 1 showed only a small temperature rise and maintained stable charging.

Example 2

The present Example is different from Example 1 in that the deposited film forming system having the power feeding course as shown in FIG. 1 was used as the i-type layer forming system 101. The deposited film forming system shown in FIG. 1 has a structure wherein, as the dielectric material 104 at least part of which is provided between the antenna-shaped discharge electrode 102 and the earth shield 105, $Al_2O_3$ ceramic 104a, BN ceramic 104b and polytetrafluoroethylene 104c are provided side by side in this order, leaving gaps of 0.5 mm between them; the ceramic 104a being provided at the part laid bare to the discharge space produced inside the vacuum vessel 108.

Under the same conditions as in Example 1 except the foregoing, a single-type photovoltaic device was continuously produced on a substrate comprised of a beltlike member, using the roll-to-roll type continuous plasma CVD system shown in FIG. 5. Thus, photovoltaic devices (Device No. Ex. 2) were produced.

The uniformity of characteristics, and yield, of the photovoltaic devices (Device No. Ex. 2) were evaluated in the same manner as those of Example 1. Results obtained are shown in Table 5.

As can be seen from Table 5, the photovoltaic devices (Device No. Ex. 2) of Example 2 are superior to the photovoltaic devices (Device No. Cp. 1) of Comparative Example 1 in both the uniformity of characteristics and the yield. Also, the uniformity of characteristics and the yield are more improved also when compared with the results of the photovoltaic devices (Device No. Ex. 1) of Example 1, shown in Table 4. This difference is presumed to be attributable to an improvement of heat insulation properties which is brought about by providing, between the dielectric materials, vacuum-tight heat insulation layers formed of the gaps.

Example 3

The present Example is different from Example 1 in that the frequency of the electric power applied when the i-type layer was formed was changed to 12 MHz in place of 100 MHz.

Under the same conditions as in Example 1 except the foregoing, a single-type photovoltaic device was continuously produced on a substrate comprised of a beltlike member, using the roll-to-roll type continuous plasma CVD system shown in FIG. 5, in which the deposited film forming system having the power feeding course as shown in FIG. 7 was used as the i-type layer forming system 101. Thus, photovoltaic devices (Device No. Ex. 3) were produced.

Comparative Example 2

The present Comparative Example is different from Comparative Example 1 in that the frequency of the electric power applied when the i-type layer was formed was changed to 12 MHz in place of 100 MHz.

Under the same conditions as in Comparative Example 1 except the foregoing, a single-type photovoltaic device was continuously produced on a substrate comprised of a beltlike member, using the roll-to-roll type continuous plasma CVD system shown in FIG. 5, in which the deposited film forming system having the power feeding course as shown in FIG. 6 was used as the i-type layer forming system 101. Thus, photovoltaic devices (Device No. Cp. 2) were produced.

The uniformity of characteristics, and yield, of these photovoltaic devices (Device No. Ex 3 and Device No. Cp. 2) were evaluated in the same manner as those of Example 1. Results obtained are shown in Table 6. Here, the changes with time of characteristics as shown in Table 6 are results obtained when reciprocals of the magnitude of changes with time of photoelectric conversion efficiency of the respective photovoltaic devices (Device No. Ex 3 and Device No. Cp. 2) are found on the basis of the value of the photovoltaic devices (Device No. Cp. 2) produced in Comparative Example 2.

Example 4

The present Example is different from Example 1 in that the frequency of the electric power applied when the i-type layer was formed was changed to 750 MHz in place of 100 MHz.

Under the same conditions as in Example 1 except the foregoing, a single-type photovoltaic device was continuously produced on a substrate comprised of a beltlike member, using the roll-to-roll type continuous plasma CVD system shown in FIG. 5, in which the deposited film forming system having the power feeding course as shown in FIG. 7 was used as the i-type layer forming system 101. Thus, photovoltaic devices (Device No. Ex. 4) were produced.

Comparative Example 3

The present Comparative Example is different from Comparative Example 1 in that the frequency of the electric power applied when the i-type layer was formed was changed to 750 MHz in place of 100 MHz.

Under the same conditions as in Comparative Example 1 except the foregoing, a single-type photovoltaic device was continuously produced on a substrate comprised of a beltlike member, using the roll-to-roll type continuous plasma CVD system shown in FIG. 5, in which the deposited film forming system having the power feeding course as shown in FIG. 6 was used as the i-type layer forming system 101. Thus, photovoltaic devices (Device No. Cp. 3) were produced.

The uniformity of characteristics, and yield, of these photovoltaic devices (Device No. Ex. 4 and Device No. Cp. 3) were evaluated in the same manner as those of Example 1. Results obtained are shown in Table 7. Here, the changes with time of characteristics as shown in Table 7 are results obtained when reciprocals of the magnitude of changes with time of photoelectric conversion efficiency of the respective photovoltaic devices (Device No. Ex. 4 and Device No. Cp. 3) are found on the basis of the value of the photovoltaic devices (Device No. Cp. 3) produced in Comparative Example 3.

As can be seen from Tables 6 and 7, the photovoltaic devices (Device No. Ex 3 and Device No. Ex. 4) of corresponding Examples are superior to the photovoltaic devices (Device No. Cp. 2 and Device No. Cp. 3) of corresponding Comparative Examples in both the uniformity of characteristics and the yield. Thus, it has become apparent that the system and process for producing photovoltaic devices by using the power feeding course according to the present invention, i.e., the power feeding course having the structure wherein at least part of the dielectric material is provided between the antenna-shaped discharge electrode and the earth shield, function effectively even when the frequency of the electric power applied when the i-type layer is formed is changed.

Example 5

The present Example is different from Example 1 in that, in the power feeding course shown in FIG. 1, provided in the i-type layer forming system, the dielectric material 104 was provided using two pieces of $Al_2O_3$, having a good heat resistance and a low dielectric loss, which were provided side by side and leaving a gap of 0.5 mm between them.

Under the same conditions as in Example 1 except the foregoing, a single-type photovoltaic device was continuously produced on a substrate comprised of a beltlike member, using the roll-to-roll type continuous plasma CVD system shown in FIG. 5. Thus, photovoltaic devices (Device No. Ex. 5) were produced.

The uniformity of characteristics, and yield, of the photovoltaic devices (Device No. Ex. 5) were evaluated in the same manner as those of Example 1. Results obtained are shown in Table 8.

As can be seen from Table 8, the photovoltaic devices (Device No. Ex. 5) of Example 5 are superior to the photovoltaic devices (Device No. Cp. 1) of Comparative Example 1 in both the uniformity of characteristics and the yield. From this result, it has become apparent that the uniformity of characteristics and the yield are improved when the $Al_2O_3$ is provided as the first dielectric material at the part laid bare to the discharge space produced inside the vacuum vessel 108, the $Al_2O_3$ is provided as the second dielectric material also at the part not laid bare to the discharge space and further a vacuum-tight heat insulation layer formed of the gap is provided between the dielectric materials.

Example 6

In the present Example, the deposited film forming system 101 having the power feeding course as shown in FIG. 4 was modified so as to be used as the i-type layer forming system 101 in the roll-to-roll type continuous plasma CVD system shown in FIG. 5. Using this system, a single-type photovoltaic device was continuously produced on a substrate comprised of a beltlike member. Here, the power feeding course provided in the i-type layer forming system (deposition chamber 101) was constituted of an antenna-shaped discharge electrode 102 formed chiefly of Ni and a dielectric material 104 made to comprise two types AlN ceramic and BN ceramic provided side by side. Air was circulated as the refrigerant 107 in the cooling means 106 to cool the dielectric material 104. The two types of dielectric materials are provided apart from each other.

The AlN ceramic used as the dielectric material 104 has also the function to make uniform any gap between facing surfaces nearest to the antenna in the power feeding course, to prevent abnormal discharge. Also, the AlN ceramic, disposed on the side laid bare to the discharge space, has good heat resistance and mechanical strength, and is provided with unevenness on its surface on the side facing the discharge space, chiefly for the purposes of preventing deposited films from coming off and preventing short-circuit current which may occur because the antenna-to-earth positioning is on the same plane.

The photovoltaic device was produced according to the procedure described below in detail.

(1) First, a bobbin 206 wound up with a beltlike member 207 made of SUS30BA stainless steel (300 mm wide, 200 m long and 0.13 mm thick) having been well degreased and cleaned and on which a silver thin film of 100 nm thick and a ZnO thin film of 1 $\mu$m thick had been vacuum-deposited as a lower electrode by sputtering was set in a vacuum chamber 201 having a substrate feed mechanism, shown in FIG. 5. The beltlike member 207 was passed through a gas gate 208a, a deposition chamber 202 for forming a first conductivity type layer, a gas gate 208b, the deposition chamber 101 for forming an i-type layer, a gas gate 208c, a deposition chamber 204 for forming a second conductivity type layer and a gas gate 208d, up to a vacuum chamber 205 having a beltlike member winding mechanism, and its tension was adjusted so that the beltlike member was not slack.

(2) Thereafter, the vacuum chambers or deposition chambers 201, 202, 101, 204 and 205 were evacuated to a vacuum of $1\times10^{-4}$ Torr or below by means of a vacuum pump (not shown).

(3) Next, 700 sccm each of $H_2$ as gate gas was flowed into gas gates 208a to 208d through gate gas feed pipes 209a to 209d, and the beltlike member 207 was heated to 350° C. by means of heating infrared lamps 210a to 210c.

(4) Next, 160 sccm of $SiH_4$ gas, 120 sccm of $PH_3/H_2$ gas (P concentration: 2%) and 700 sccm of $H_2$ gas were fed into the deposition chamber 202 through a gas feed means 211a. Also, 100 sccm of $SiH_4$ gas and 500 sccm of $H_2$ gas were fed into the deposition chamber 101 through a gas feed means 211b. Still also, 10 sccm of $SiH_4$ gas, 250 sccm of $BF_3/H_2$ gas ($BF_3$ concentration: 2%) and 1,000 sccm of $H_2$ gas were fed into the deposition chamber 204 through a gas feed means 211C. After the gases were thus fed into the chambers, the pressure inside the deposition chambers 202 and 204 were adjusted to 1.02 Torr by controlling the aperture of throttle valves 212a and 212c while watching a pressure gauge (not shown). The pressure inside the deposition chamber 101 was adjusted to 16 mTorr by controlling the aperture of a throttle valve 212b while watching a pressure gauge (not shown).

(5) Thereafter, an electric power with a frequency of 13.56 MHz and an electric power with a frequency of 100 MHz were supplied into the deposition chambers 202 and 204 and the deposition chamber 101, respectively.

(6) Next, the beltlike member 207 was set being transported to form the first conductivity type layer, i-type layer and second conductivity type layer in this order on the beltlike member.

(7) Next, cells on which films were continuously superposed in this way were cut out. On each second conductivity type layer thereof, ITO ($In_2O_3+SnO_2$) was deposited by vacuum deposition in a thickness of 70 nm as a transparent electrode and Al was deposited by vacuum deposition in a thickness of 2 $\mu$m as a collector electrode. Thus, photovoltaic devices (Device No. Ex. 6) were produced.

Conditions for producing the above photovoltaic devices (Device No. Ex. 6) are summarized in Table 9.

Example 7

The present Example is different from Example 6 in that, in the power feeding course as shown in FIG. 4, the cooling of the dielectric material 104 by the cooling means 106 was not carried out.

Under the same conditions as in Example 6 except the foregoing, a single-type photovoltaic device was continuously produced on a substrate comprised of a beltlike member, using the roll-to-roll type continuous plasma CVD system shown in FIG. 5. Thus, photovoltaic devices (Device No. Ex. 7) were produced.

On the photovoltaic devices (Device No. Ex. 6) produced in Example 6 and the photovoltaic devices (Device No. Ex. 7) produced in Example 7, their uniformity of characteristics, and yield, were evaluated.

The uniformity of characteristics was evaluated by examining changes with time of photoelectric conversion efficiency of the photovoltaic devices (Device No. Ex. 6 and Device No. Ex. 7), which were both cut out at intervals of 10 m in a size of 5 cm square each and placed under irradiation by light of AM 1.5 (100 mW/cm$^2$) to measure their photoelectric conversion efficiency.

The changes with time of characteristics, and yield, of the photovoltaic devices (Device No. Ex. 6 and Device No. Ex. 7) are shown in Table 10. Here, the changes with time of characteristics as shown in Table 10 are results obtained when reciprocals of the magnitude of changes with time of photoelectric conversion efficiency of the respective photovoltaic devices (Device No. Ex. 6 and Device No. Ex. 7) are found on the basis of the value of the photovoltaic devices (Device No. Ex. 7) produced in Example 6.

As can be seen from Table 10, the photovoltaic devices (Device No. Ex. 6) of Example 6 are superior to the photovoltaic devices (Device No. Ex. 7) of Example 7 in both the uniformity of characteristics and the yield.

Now, in comparison of the photovoltaic device according to Example 7 with the photovoltaic device according to Comparative Example 1, the value of changes with time of characteristics of the photovoltaic device according to Example 7 was 1.29 on the basis of the photoelectric conversion efficiency of the photovoltaic device according to Comparative Example 1, and was found to be superior to that of the photovoltaic device according to Comparative Example 1.

In comparison of the photovoltaic device according to Example 6 with the photovoltaic device according to Comparative Example 1, the value of changes with time of characteristics of the photovoltaic device according to Example 6 was 1.29×1.29= about 1.66, and was found to be very superior to that of the photovoltaic device according to Comparative Example 1.

Example 8

The present Example is different from Example 6 in that, in the power feeding course as shown in FIG. 4, water was circulated in place of the air, as the refrigerant 107 used when the dielectric material 104 is cooled by the cooling means 106.

Under the same conditions as in Example 6 except the foregoing, a single-type photovoltaic device was continuously produced on a substrate comprised of a beltlike member, using the roll-to-roll type continuous plasma CVD system shown in FIG. 5. Thus, photovoltaic devices (Device No. Ex. 8) were produced.

The uniformity of characteristics, and yield, of the photovoltaic devices (Device No. Ex. 8) were evaluated in the same manner as those of Example 1. Results obtained are shown in Table 11.

As can be seen from Table 11, the photovoltaic devices (Device No. Ex. 8) of Example 8 are superior to the photovoltaic devices (Device No. Ex. 7) of Example 7 in both the uniformity of characteristics and the yield. From this result, it can be concluded that substantially the same effect can be obtained also when the water is circulated in place of the air, as the refrigerant 107 used when the dielectric material 104 is cooled by the cooling means 106.

It was also ascertained that the power feeding course used in the production of the photovoltaic devices (Device No. Ex. 7) of Example 7 came to have a high temperature and, during discharge, caused an unstable state, e.g., discharge flickering, whereas the power feeding course used in the production of the photovoltaic devices (Device No. Ex. 6 and Device No. Ex. 8) of Examples 6 and 8 showed only a small temperature rise and maintained stable charging.

Example 9

The present Example is different from Example 6 in that the frequency of the electric power applied when the i-type layer was formed was changed to 10 MHz in place of 100 MHz.

Under the same conditions as in Example 6 except the foregoing, a single-type photovoltaic device was continuously produced on a substrate comprised of a beltlike member, using the roll-to-roll type continuous plasma CVD system shown in FIG. 5, in which the deposited film forming system having the power feeding course as shown in FIG. 4 was used as the i-type layer forming system 101. Thus, photovoltaic devices (Device No. Ex. 9) were produced.

Example 10

The present Example is different from Example 7 in that the frequency of the electric power applied when the i-type layer was formed was changed to 10 MHz in place of 100 MHz.

Under the same conditions as in Example 7 except the foregoing, a single-type photovoltaic device was continuously produced on a substrate comprised of a beltlike member, using the roll-to-roll type continuous plasma CVD system shown in FIG. 5, in which the deposited film forming system having the power feeding course as shown in FIG. 4 was used as the i-type layer forming system 101. Thus, photovoltaic devices (Device No. Ex. 10) were produced.

The uniformity of characteristics, and yield, of these photovoltaic devices (Device No. Ex. 9 and Device No. Ex. 10) were evaluated in the same manner as those of Example 6. Results obtained are shown in Table 12. Here, the changes with time of characteristics as shown in Table 12 are results obtained when reciprocals of the magnitude of changes with time of photoelectric conversion efficiency of the respective photovoltaic devices (Device No. Ex. 9 and Device No. Ex. 10) are found on the basis of the value of the photovoltaic devices (Device No. Ex. 10) produced in Example 10.

Example 11

The present Example is different from Example 6 in that the frequency of the electric power applied when the i-type layer was formed was changed to 750 MHz in place of 100 MHz.

Under the same conditions as in Example 6 except the foregoing, a single-type photovoltaic device was continuously produced on a substrate comprised of a beltlike member, using the roll-to-roll type continuous plasma CVD system shown in FIG. 5, in which the deposited film forming system having the power feeding course as shown in FIG. 4 was used as the i-type layer forming system 101. Thus, photovoltaic devices (Device No. Ex. 11) were produced.

Example 12

The present Example is different from Example 7 in that the frequency of the electric power applied when the i-type layer was formed was changed to 750 MHz in place of 100 MHz.

Under the same conditions as in Example 7 except the foregoing, a single-type photovoltaic device was continuously produced on a substrate comprised of a beltlike member, using the roll-to-roll type continuous plasma CVD system shown in FIG. 5, in which the deposited film forming system having the power feeding course as shown in FIG. 4 was used as the i-type layer forming system 101. Thus, photovoltaic devices (Device No. Ex. 12) were produced.

The uniformity of characteristics, and yield, of these photovoltaic devices (Device No. Ex. 11 and Device No. Ex. 12) were evaluated in the same manner as those of Example 6. Results obtained are shown in Table 13. Here, the changes with time of characteristics as shown in Table 13 are results obtained when reciprocals of the magnitude of changes with time of photoelectric conversion efficiency of the respective photovoltaic devices (Device No. Ex. 11 and Device No. Ex. 12) are found on the basis of the value of the photovoltaic devices (Device No. Ex. 12) produced in Example 12.

As can be seen from Tables 12 and 13, the photovoltaic devices (Device No. Ex. 9 and Device No. Ex. 11) of Examples 9 and 11 are superior to the photovoltaic devices (Device No. Ex. 10 and Device No. Ex. 12) of Examples 10 and 12 in both the uniformity of characteristics and the yield. Also, it has become apparent that the system and process for producing photovoltaic devices by using the power feeding course according to the present invention, i.e., the power feeding course having the structure wherein at least part of the dielectric material is provided between the antenna-shaped discharge electrode and the earth shield and also the dielectric material is cooled, function effectively even when the frequency of the electric power applied when the i-type layer is formed is changed.

Example 13

The present Example is different from Example 6 in that the deposited film forming system 101 shown in FIG. 7 was used in place of the deposited film forming system shown in FIG. 4. What differs greatly is that, in the FIG. 4 deposited film forming system 101, the earth shield 105 is disposed between the dielectric material 104 and the cooling means 106, whereas, in the FIG. 7 deposited film forming system, the cooling means 106 is in direct contact with the dielectric material 104. Also, in the present Example, water was used in place of the air, as the refrigerant 107 to be circulated in the cooling means 106.

Under the same conditions as in Example 6 except the foregoing, a single-type photovoltaic device was continuously produced on a substrate comprised of a beltlike member, using the roll-to-roll type continuous plasma CVD system shown in FIG. 5. Thus, photovoltaic devices (Device No. Ex. 13) were produced.

The uniformity of characteristics, and yield, of these photovoltaic devices (Device No. Ex. 13) were evaluated in the same manner as those of Example 6. Results obtained are shown in Table 14.

As can be seen from Table 14, the photovoltaic devices (Device No. Ex. 13) of Example 13 are superior to the photovoltaic devices (Device No. Ex. 7) of Example 7 in both the uniformity of characteristics and the yield. Also, compared with the results of Example 8 shown in Table 11 (the instance where the water was used as the refrigerant in the deposited film forming system 101), the results of Example 13 were found to be superior. From these results, it has become apparent that the deposited film forming system 101 shown in FIG. 7, in which the cooling means 106 is disposed in direct contact with the dielectric material 104, can attain the effect of the present invention more remarkably than the deposited film forming system 101 shown in FIG. 4.

Thus, as can be seen from Examples 1 to 13 and Comparative Examples 1 to 3, the deposited film forming system in which the dielectric material surrounds the power supply conductor may less causes the changes with time of characteristics and can achieve a higher yield than the deposited film forming system in which the dielectric material does not surround the power supply conductor.

As also can be seen from Examples 1 to 13 and Comparative Examples 1 to 3, the deposited film forming system so set up that at least part of the plurality of dielectric materials surrounds the power supply conductor can form photovoltaic devices having small changes with time of characteristics, and also photovoltaic devices having smaller changes with time of characteristics can be obtained when the dielectric material is cooled.

As still also can be seen therefrom, the deposited film forming system so set up that the cooling means is disposed in direct contact with the dielectric material can provide photovoltaic devices having much smaller changes with time of characteristics.

As described above, according to the present invention, since at least part of the dielectric material is provided around the power supply conductor constituting the power feeding course the semiconductor thin-film forming system has, the applied-power loss may less occur when the electric power is supplied and also the power feeding course, even though a part thereof is exposed to plasma, can be kept from temperature rise, and hence stable discharge can be maintained for a long time. Thus, the system and process according to the present invention can form semiconductor thin-film devices such as photovoltaic devices in a large quantity and in a good stability which have a high photoelectric conversion efficiency, a high quality and a superior uniformity over a large area, and have a higher reproducibility and less defects.

In the embodiment where the first and second dielectric materials are provided side by side or the second dielectric material is constituted of two materials, leaving a gap between them to provide the vacuum-tight heat insulation layer, the loss of electric power can be kept from occurring while effectively keeping the power feeding course from its temperature rise.

In addition, according to the present invention, in the embodiment where at least part of the dielectric material is provided around the power supply conductor constituting the power feeding course the semiconductor thin-film forming system has and also the means for cooling the dielectric material is provided in that course, the loss of electric power can made less occur when electric power is supplied and also the power feeding course can be kept from its temperature rise even when exposed to plasma, and hence stable discharge can be maintained for a long time. Thus, the system and process according to the present invention can form semiconductor thin-film devices such as photovoltaic devices in a large quantity and in a good stability which have a high photoelectric conversion efficiency, a high quality and a superior uniformity over a large area, and have a higher reproducibility and less defects.

The use of a liquid as the refrigerant circulated in the cooling means also makes it possible to cool the power feeding course effectively.

TABLE 1

| Dielectric material | Thermal conductivity (W/mK) | Film thickness distribution |
|---|---|---|
| A | 170 | ±8% |
| B | 90 | ±9% |
| C | 3 | ±15% |
| D | 80 | ±15% |
| E | 33 | ±9% |
| F | 7 | ±12% |
| G | 12 | ±10% |

TABLE 2

| Dielectric material | $\epsilon \tan\delta$ | Film thickness distribution |
|---|---|---|
| H | $6.5 \times 10^{-4}$ | ±7% |
| I | $2.4 \times 10^{-3}$ | ±9% |
| J | $5.5 \times 10^{-2}$ | ±14% |
| K | $5.7 \times 10^{-3}$ | ±9% |
| L | $2.0 \times 10^{-3}$ | ±8% |
| M | $2.0 \times 10^{-2}$ | ±10% |
| N | $9.5 \times 10^{-3}$ | ±8% |
| O | $3.5 \times 10^{-2}$ | ±12% |
| P | $4.2 \times 10^{-2}$ | ±12% |

TABLE 3

Substrate: SUS430BA, 0.13 mm thick
Reflecting layer: Silver (Ag) thin film, 100 nm thick
Reflection enhancing layer: Zinc oxide (ZnO) thin film, 1 μm thick
Gate gas: 700 sccm from each gate

| Thickness (nm) | Gasses used & flow rate (sccm) | | Frequency (MHz) | Electric power (W) | Pressure (Torr) | Substrate temp. (° C.) |
|---|---|---|---|---|---|---|
| First conductivity type layer: | | | | | | |
| 40 | $SiH_4$ | 160 | 13.56 | 200 | 1.02 | 350 |
|  | $PH_3/H_2$ (2% dilution) | 120 | | | | |
|  | $H_2$ | 700 | | | | |
| i-type layer: | | | | | | |
| 100 | $SiH_4$ | 100 | 100 | 700 | 0.016 | 350 |
|  | $H_2$ | 500 | | | | |
| Second conductivity type layer: | | | | | | |
| 5 | $SiH_4$ | 10 | 13.56 | 200 | 1.02 | 350 |
|  | $BF_3/H_2$ (2% dilution) | 250 | | | | |
|  | $H_2$ | 1,000 | | | | |

Transparent electrode: ITO thin film, 70 nm thick
Collector electrode: Al thin film, 2 μm thick

TABLE 4

| Photovoltaic devices | Changes with time of characteristics | Yield (%) |
|---|---|---|
| Device No. Ex. 1 | 1.27 | 93 |
| Device No. Cp. 1 | 1.00 | 68 |

TABLE 5

| Photovoltaic devices | Changes with time of characteristics | Yield (%) |
|---|---|---|
| Device No. Ex. 2 | 1.36 | 95 |
| Device No. Cp. 1 | 1.00 | 68 |

TABLE 6

| Photovoltaic devices | Changes with time of characteristics | yield (%) |
|---|---|---|
| Device No. Ex. 3 | 1.34 | 96 |
| Device No. Cp. 2 | 1.00 | 69 |

TABLE 7

| Photovoltaic devices | Changes with time of characteristics | Yield (%) |
|---|---|---|
| Device No. Ex. 4 | 1.37 | 94 |
| Device No. Cp. 3 | 1.00 | 66 |

TABLE 8

| Photovoltaic devices | Changes with time of characteristics | Yield (%) |
|---|---|---|
| Device No. Ex. 5 | 1.38 | 96 |
| Device No. Cp. 1 | 1.00 | 68 |

TABLE 9

Substrate: SUS430BA, 0.13 mm thick
Reflecting layer: Silver (Ag) thin film, 100 nm thick
Reflection enhancing layer: Zinc oxide (ZnO) thin film, 1 μm thick
Gate gas: 700 sccm from each gate

| Thickness (nm) | Gasses used & flow rate (sccm) | | Frequency (MHz) | Electric power (W) | Pressure (Torr) | Substrate temp. (° C.) |
|---|---|---|---|---|---|---|
| First conductivity type layer: | | | | | | |
| 40 | $SiH_4$ | 160 | 13.56 | 200 | 1.02 | 350 |
|  | $PH_3/H_2$ (2% dilution) | 120 | | | | |
|  | $H_2$ | 700 | | | | |
| i-type layer: | | | | | | |
| 100 | $SiH_4$ | 100 | 100 | 700 | 0.016 | 350 |
|  | $H_2$ | 500 | | | | |
| Second conductivity type layer: | | | | | | |
| 5 | $SiH_4$ | 10 | 13.56 | 200 | 1.02 | 350 |
|  | $BF_3/H_2$ (2% dilution) | 250 | | | | |
|  | $H_2$ | 1,000 | | | | |

Transparent electrode: ITO thin film, 70 nm thick
Collector electrode: Al thin film, 2 μm thick

TABLE 10

| Photovoltaic devices | Changes with time of characteristics | Yield (%) |
|---|---|---|
| Device No. Ex. 6 | 1.29 | 93 |
| Device No. Ex. 7 | 1.00 | 69 |

TABLE 11

| Photovoltaic devices | Changes with time of characteristics | Yield (%) |
|---|---|---|
| Device No. Ex. 8 | 1.34 | 96 |
| Device No. Ex. 7 | 1.00 | 69 |

TABLE 12

| Photovoltaic devices | Changes with time of characteristics | Yield (%) |
|---|---|---|
| Device No. Ex. 9 | 1.33 | 95 |
| Device No. Ex. 10 | 1.00 | 67 |

TABLE 13

| Photovoltaic devices | Changes with time of characteristics | Yield (%) |
|---|---|---|
| Device No. Ex. 11 | 1.35 | 93 |
| Device No. Ex. 12 | 1.00 | 67 |

TABLE 14

| Photovoltaic devices | Changes with time of characteristics | Yield (%) |
|---|---|---|
| Device No. Ex. 13 | 1.37 | 97 |
| Device No. Ex. 7 | 1.00 | 69 |

What is claimed is:

1. A deposited film forming system having at least a vacuum vessel, means for feeding a film-forming material gas into the vacuum vessel, a discharge electrode provided inside the vacuum vessel, used to make the material gas into a plasma, and a power supply conductor for applying a high-frequency power to the discharge electrode; the system comprising:

an earth shield so disposed as to surround the power supply conductor inside the vacuum vessel; and a plurality of dielectric materials at least part of which is disposed between the power supply conductor and the earth shield, wherein the dielectric materials comprise a first dielectric material comprising AlN at least partly laid bare to a discharge space produced inside the vacuum vessel and a second dielectric material comprising BN not laid bare to the discharge space, and wherein the first dielectric material has a thermal conductivity of 12 W/mK or above and the second dielectric material has a dielectric loss ($\epsilon$ tan $\delta$) of $2\times10^{-2}$ or below.

2. A deposited film forming system having at least a vacuum vessel, means for feeding a film-forming material gas into the vacuum vessel, a discharge electrode provided inside the vacuum vessel, used to make the material gas into a plasma, and a power supply conductor for applying a high-frequency power to the discharge electrode; the system comprising:

an earth shield so disposed as to surround the power supply conductor inside the vacuum vessel; and a plurality of dielectric materials at least part of which is disposed between the power supply conductor and the earth shield, wherein the dielectric materials comprise a first dielectric material comprising $Al_2O_3$, at least partly laid bare to a discharge space produced inside the vacuum vessel and a second dielectric material comprising BN and polytetrafluoroethylene provided side by side, not laid bare to the discharge space, wherein a gap is provided between the first dielectric material and the second dielectric material, and wherein the first dielectric material has a thermal conductivity of 12 W/mK or above and the second dielectric material has a dielectric loss ($\epsilon$ tan $\delta$) of $2\times10^{-2}$ or below.

3. A deposited film forming process comprising the steps of:

feeding a film-forming material gas into a vacuum vessel provided with a discharge electrode inside the vessel; and applying a high-frequency power through a power supply conductor for applying the high-frequency power to the discharge electrode to make the material gas into a plasma, to form a deposited film on a substrate provided inside the vacuum vessel;

the high-frequency power being fed to the discharge electrode through the power supply conductor, by the aid of;

an earth shield so disposed as to surround the power supply conductor inside the vacuum vessel; and a plurality of dielectric materials at least part of which is disposed between the power supply conductor and the earth shield wherein the first dielectric material comprises AlN and the second dielectric material comprise BN and polytetrafluoroethylene provided side by side.

4. A deposited film forming process comprising the steps of:

feeding a film-forming material gas into a vacuum vessel provided with a discharge electrode inside the vessel; and applying a high-frequency power through a power supply conductor for applying the high-frequency power to the discharge electrode to make the material gas into a plasma, to form a deposited film on a substrate provided inside the vacuum vessel;

the high-frequency power being fed to the discharge electrode through the power supply conductor, by the aid of;

an earth shield so disposed as to surround the power supply conductor inside the vacuum vessel; and a plurality of dielectric materials at least part of which is disposed between the power supply conductor and the earth shield, wherein the first dielectric material comprises $Al_2O_3$ and the second dielectric material comprise BN and polytetrafluoroethylene provided side by side.

* * * * *